United States Patent
Ball

[11] Patent Number: 5,976,964
[45] Date of Patent: Nov. 2, 1999

[54] METHOD OF IMPROVING INTERCONNECT OF SEMICONDUCTOR DEVICE BY UTILIZING A FLATTENED BALL BOND

[75] Inventor: Michael B. Ball, Boise, Id.

[73] Assignee: Micron Technology, Inc., Boise, Id.

[21] Appl. No.: 08/840,604

[22] Filed: Apr. 22, 1997

[51] Int. Cl.[6] .................................................. H01L 21/44
[52] U.S. Cl. ...................... 438/613; 438/617; 438/123
[58] Field of Search .................................. 438/123, 613, 438/610, 611, 612, 617; 228/180.5, 4.5

[56] References Cited

U.S. PATENT DOCUMENTS

| | | | |
|---|---|---|---|
| 4,176,443 | 12/1979 | Iannuzzi et al. | 438/106 |
| 4,486,945 | 12/1984 | Aigoo | 438/123 |
| 4,733,289 | 3/1988 | Tsurumaru | 257/640 |
| 4,750,666 | 6/1988 | Neugebauer et al. | 228/160 |
| 4,821,148 | 4/1989 | Kobayashi et al. | 438/123 |
| 5,058,798 | 10/1991 | Yamazaki et al. | 228/904 |
| 5,101,263 | 3/1992 | Kitano et al. | 257/734 |
| 5,132,772 | 7/1992 | Fetty | 257/779 |
| 5,235,212 | 8/1993 | Shimizu et al. | 257/780 |
| 5,298,793 | 3/1994 | Kotani et al. | 257/765 |
| 5,328,079 | 7/1994 | Mathew et al. | 228/180.5 |
| 5,343,064 | 8/1994 | Spangler et al. | 257/350 |
| 5,371,654 | 12/1994 | Beaman et al. | 361/744 |
| 5,455,195 | 10/1995 | Ramsey et al. | 438/612 |
| 5,492,863 | 2/1996 | Higgins, III | 438/610 |
| 5,550,083 | 8/1996 | Koide et al. | 438/4 |
| 5,559,054 | 9/1996 | Adamjee | 438/617 |
| 5,656,830 | 8/1997 | Zechman | 257/784 |
| 5,740,956 | 4/1998 | Seo et al. | 438/617 |
| 5,764,486 | 6/1998 | Pendse | 361/774 |

Primary Examiner—Carl Whitehead, Jr.
Assistant Examiner—Khanh Duong
Attorney, Agent, or Firm—Trask, Britt & Rossa

[57] ABSTRACT

A method of forming a semiconductor device assembly comprising forming a wire bump on at least one bond pad on the active surface of a semiconductor device and connecting one end of a wire to the wire bump using a wire bond. The wire bump may be flattened before connecting one end of a wire thereto.

9 Claims, 4 Drawing Sheets

METHOD OF IMPROVING INTERCONNECT OF SEMICONDUCTOR DEVICE BY UTILIZING A FLATTENED BALL BOND

BACKGROUND OF THE INVENTION

1. Field of the Invention

The present invention relates to improved wire bonds with the bond pads of semiconductor devices and the lead frames associated therewith. More specifically, the present invention relates to improved wire bonds with ball bumps previously made on the bond pads of semiconductor devices.

2. State of the Art

In semiconductor device manufacture, a single semiconductor die (or chip) is typically mounted within a sealed package. In general, the package protects the semiconductor die from damage and from contaminants in the surrounding environment. In addition, the package provides a substantial lead system for connection the electrical devices formed on the die to a printed circuit board or other external circuitry.

Each semiconductor die has a lower surface (commonly referred to as the back of the die) that is devoid of circuitry, and an upper surface (commonly referred to as the active surface or face of the die) having integrated circuitry constructed thereon. The integrated circuitry is electrically accessible via bond pads located on the active surface of the semiconductor die which may be arranged in a wide variety of patterns, such as around the periphery of the semiconductor die, the center of the semiconductor die, both, etc.

Typically, the initial component in the packaging process is a leadframe. The leadframe is a metal frame which supports the semiconductor die for packaging and provides the leads for the final semiconductor package. A typical leadframe strip is produced from metal sheet stock (usually a copper, copper alloy, alloy 42, etc.) and is adapted to mount the semiconductor die.

A conventional leadframe has the semiconductor die adhesively mounted on a die paddle of the leadframe while the lead fingers (leads) extend around the periphery of the semiconductor die (the edges) terminating adjacent thereto. Subsequently, wire bonds are made to connect the bond pads on the active surface of the semiconductor die to the appropriated lead finger of the leadframe. After the wire bonding operation, the lead frame and semiconductor die are encapsulated in a transfer die molding process. After encapsulation, the lead frame is trimmed with the remainder of the individual lead fingers being formed into the desired packaging configuration.

One of the problems associated with conventional leadframe configurations is that with the decreasing size of the semiconductor die and the increasing amount of circuitry included in the semiconductor die it is necessary to connect an ever increasing number of bond pads on the active surface of the semiconductor die with an ever increasing number of lead finger of the lead frame. This requires that the bond pads on the semiconductor die be located on smaller pitch spacings and the width of the lead finger be smaller. This, in turn, leads to smaller wire bonds on both the bond pads of the semiconductor die and the lead fingers of the leadframe which causes the wire bonds to be more highly stressed by the forces placed on them.

In a Leads-Over-Chip (LOC) type lead frame configuration for an integrated circuit semiconductor device the lead fingers of the lead frame extend over the active surface of the semiconductor die being insulated therefrom by tape which is adhesively bonded to the active surface of the semiconductor die and the bottom of the lead fingers. In this manner, the semiconductor die is supported directly from the lead fingers of the leadframe. Electrical connections are made between the lead finger of the lead frame and the bond pads on the active surface of the semiconductor die by way of wire bonds extending therebetween. After wire bonding, the leadframe and semiconductor die are encapsulated in suitable plastic material. Subsequently, the lead fingers are trimmed and formed to the desired configuration to complete the packaged semiconductor device assembly.

One of the shortcomings of the prior art LOC semiconductor die assemblies is that the tape used to bond to the lead fingers of the leadframe does not adequately lock the lead fingers in position for the wire bonding process. At times, the adhesive on the tape is not strong enough to fix or lock the lead fingers in position for wire bonding as the lead fingers pull away from the tape before wire bonding. Alternately, the lead fingers will pull away from the tape after wire bonding of the semiconductor die but before encapsulation of the semiconductor die and leadframe either causing shorts between adjacent wire bonds or the wire bonds to pull loose from either the bond pads of the semiconductor die or lead finger of the leadframe. As before with conventional leadframes, with the decreasing size of the semiconductor die and the increasing amount of circuitry included in the semiconductor die it is necessary to connect an ever increasing number bond pads on the active surface of the semiconductor die with an ever increasing number of lead fingers of the lead frame. This requires that the bond pads on the semiconductor die be located on smaller pitch spacings and the width of the lead fingers be smaller. This, in turn, leads to smaller wire bonds on both the bond pads and the lead fingers of the leadframe which cause the wire bonds to be more highly stressed by the forces placed on them.

Therefore, a need exists for increased strength wire bonds between the lead fingers of a leadframe and the bond pads of a semiconductor die, particularly, as the size of the semiconductor die, size of the bond pads thereon, the size of the lead fingers connected by wire bonds to bond pads, and the pitch thereof, all decrease.

It is known in the art to form bumps on the bond pads of semiconductor die using wire bonding apparatus for subsequent bond Tape Automated Bonding (TAB) or flip-chip (face-down) assembly of bare chip die to a substrate. Such is illustrated in U.S. Pat. Nos. 4,750,666 and 5,058,798. It is also known to repair defective or broken wire bonds to bond pads of semiconductor die by forming a flattened pad over the remaining portion of the wire and, subsequently, bonding the end of another wire thereover. Such is illustrated in U.S. Pat. No. 5,550,083. Other types of wire bonding operations on the bond pads of a semiconductor die are illustrated in U.S. Pat. Nos. 5,235,212, 5,298,793, 5,343,064, 5,371,654, and 5,492,863.

SUMMARY OF THE INVENTION

The present invention relates to improved wire bonds with the bond pads of semiconductor devices and the lead fingers of lead frames. More specifically, the present invention relates to improved wire bonds with ball bonds previously made on the bond pads of semiconductor devices and/or lead fingers of lead frames.

The present invention will be better understood when the drawings are taken in conjunction with the following description of the invention.

DESCRIPTION OF THE INVENTION

Figure 1:
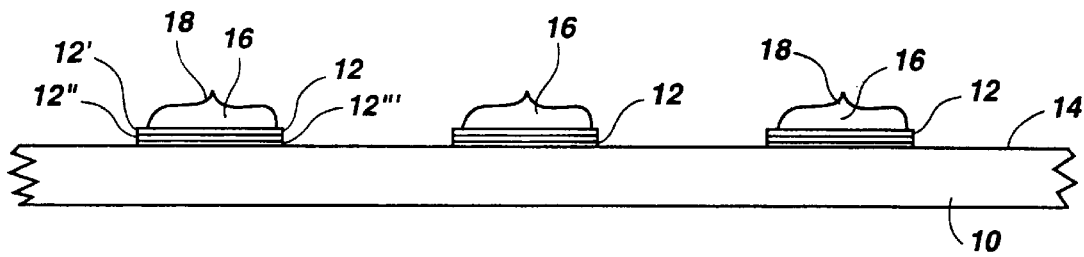
FIG. 1 is a cross-sectional view of a semiconductor die having a plurality of bond pads thereon with wire bumps formed thereon.

Referring to drawing FIG. 1, a semiconductor die 10 is illustrated having a plurality of bond pads 12 located on the active surface 14 thereof. The semiconductor device 10 may be of any desired type having any desired configuration of bond pads 12 connected to the active circuitry therein. As illustrated, a wire bump 16 is secured to the bond pads 12 of the semiconductor device 10. The wire bumps 16 have been formed or secured to the bond pads 12 by any desired well known wire bonding apparatus used in the industry. The wire bumps may be formed using any desired type of wire, such as aluminum, copper, copper alloy, aluminum-copper alloy, gold, silver, gold-silver alloy, platinum, etc., although gold wire is preferred to be used as gold does not form an oxide after the deposition on the bond pad 12 as would aluminum, silver, etc.

During the formation of the wire bump 16 on the bond pad 12, the wire bump 16 is formed on the bond pad 12, typically, as heat associated with the bond is a consideration, by the thermo-sonic bonding of a piece of wire from a supply thereof using an ultra-sonic energy source to the bond pad 12 with the wire being terminated after the thermo-sonic bonding to the bond pad 12 by pulling the piece of wire bonded to the bond pad 12 from the supply of remaining wire usually leaving the bump slightly deformed as depicted at the deformation 18. Alternately, if heat associated with the bond is not a problem, a temperature of 300° C. –400° C. can be tolerated, a thermo-compression type wire bonding apparatus may be used, but is not preferred.

If desired, the bond pad 12 may be comprised of layers of different metals to enhance bonding characteristics. For instance, layer 12''' is a metal which has an affinity for bonding to the semiconductor material forming the semiconductor device 10. Typically, the layer 12''' would be of aluminum. The layer 12'' is an intermediate layer of metal to help prevent intermetallic compounds from forming between the layer 12''' and the wire bump 16. For instance, the layer 12'' commonly comprises a layer of chromium. The layer 12' is a metal layer which has an affinity for bonding to the wire bump 16 and the layer 12''. If a gold wire bump 16 is formed, the metal layer 12' is typically a gold metal layer. In this manner by forming the bond pad 12 of multiple layers of metal, a strong bond between the wire bump 16 and the bond pad 12 may be formed, particularly since gold does not form an oxide coating after the deposition thereof to affect any subsequent bond of material thereto.

After the wire bump 16 has been formed on the bond pad 12, since the wire bump 16 is typically deformed as illustrated at 18, it is preferred to flatten the wire bump 16 to form a flattened surface thereon before subsequently forming a wire bond thereto.

Figure 2:
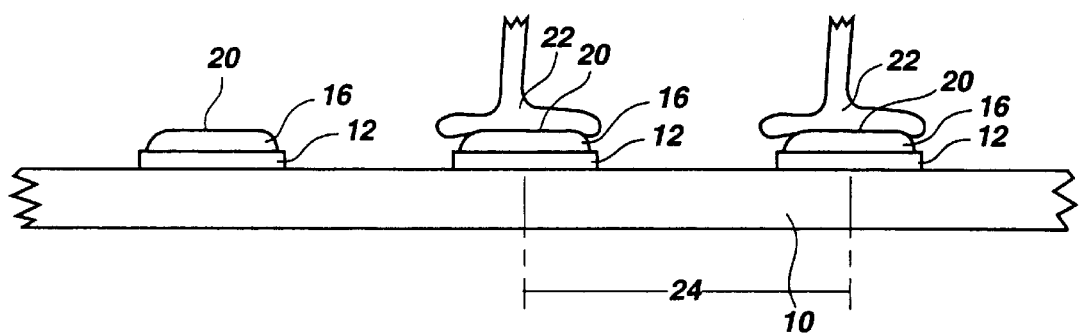
FIG. 2 is a cross-sectional view of a semiconductor die having a plurality of bond pads thereon with wire bumps formed thereon and wire bonds formed on the wire bumps.

Referring to drawing FIG. 2, a bond pad 12 is illustrated having a wire bump 16 located thereon having a flattened upper surface 20 located thereon. Additionally shown, are bond pads 12 having flattened wire bumps 16 thereon having, in turn, flattened upper surfaces 20 thereon and wire bonds 22 attached thereto. The wire bonds 22 may be of larger diameter or size than that of the wire bumps 16 thereby allowing the bond pads 12 of the semiconductor device 10 to be placed more closely together on a smaller pitch 24 or spacing on the semiconductor device 10.

Figure 3:
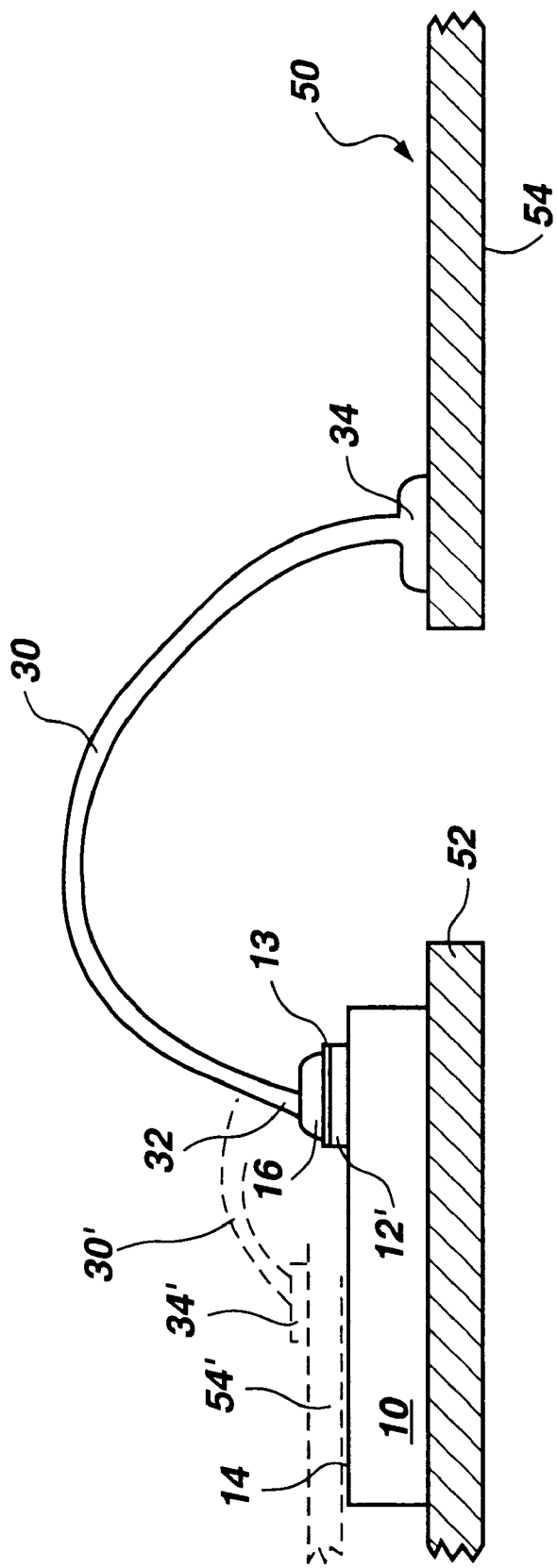
FIG. 3 is a cross-sectional view of a semiconductor die having a plurality of bond pads thereon with wire bumps formed thereon and a wire bond formed on the wire bump extending to a lead finger of a lead frame.

Referring to drawing FIG. 3, a semiconductor device 10 is illustrated being secured to a die paddle 52 of a conventional lead frame 50, shown in cross-section. The semiconductor device 10 has one or more bond pads 12 in any desired pattern or configuration located on the active surface 14 thereof. Each bond pad 12 also has a wire bump 16 formed thereon as previously described hereinabove. The conventional lead frame 50 also includes a plurality of lead fingers 54 which extend and terminate adjacent a side of the semiconductor device 10. Further illustrated is a wire 30 which is bonded by means of a wedge type wire bond 32 to the wire bump 16 located on the bond pad 12 while the other end of the wire 30 is bonded by means of a ball-type wire bond 34 to the end of the lead finger 50 of the conventional lead frame 54. As illustrated, the bond pad 12 may include a coating of suitable material as described herein to help facilitate the bonding of the wire bump 16 and the wedge type bond 32 thereto. It should be appreciated that the wire bonding of the wire 30 by a wedge type bond 32, to the wire bump 16 on the bond pad 12, and the ball-type bond 34 to the lead finger 54, is the opposite of the typical wire bonding process using well known conventional wire bonding equipment. Since the bond pad 12 includes a wire bump 16 thereon, a high strength wedge type bond may be used thereon which results in a satisfactory wire bond to the bond pad as the wire bump 16 provides a bonding environment to yield a high strength wire bond. Also, since a wedge type wire bond 32 is used to form the wire bond of the wire 30 and the bond pad 12, a high strength ball-type wire bond 34 may be used to form a high strength wire bond to the lead finger 54 using the typical wire bonding process and equipment. In this manner, as it is commonly known in the industry, the potential problem of a "second-bond, no-stick" wire bond of the wire 30 with respect to the lead finger is minimized. This technique offers the advantage of using lead frames where the lead fingers or portions thereof do not need to be plated with metals to enhance the wire bonding of a wire thereto. Alternately, as illustrated in dotted lines in drawing FIG. 3, a leads-over-chip (LOC) typed lead frame having the lead fingers 54' extending over the active surface 14 of the semiconductor device 10 may be used rather than a conventional lead frame 50. In such instance, the wire bonds are made in the same manner as described hereinbefore with a ball-type bond 34' being made on the lead finger 54'.

Figure 4:
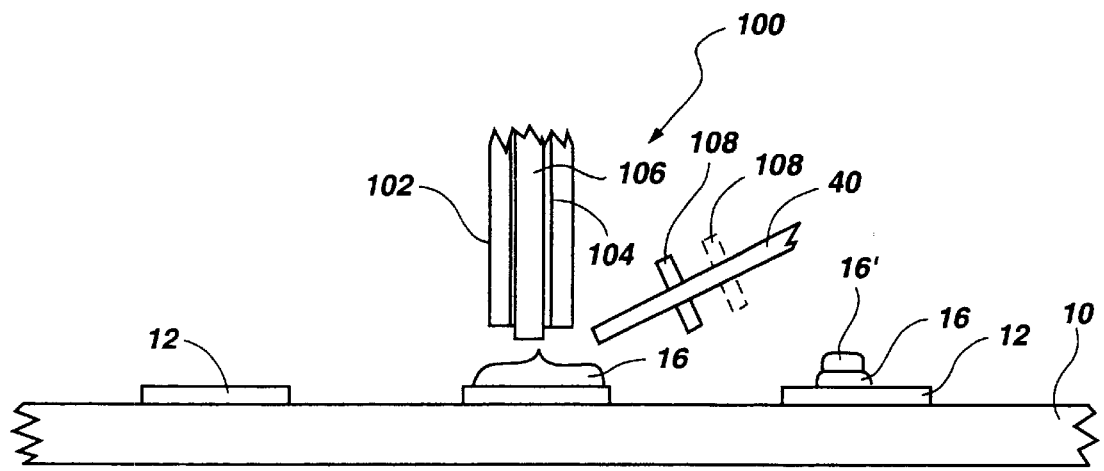
FIG. 4 is a view of an apparatus for forming wire bumps on the bond pads of semiconductor die.

Referring to drawing FIG. 4, a wire bonding and wire bump flattening apparatus 100 is schematically illustrated. The apparatus 100 comprises a bond head 102 having a concentrically located punch 106 located in the bore 104 thereof and one or more wire clamps 108 to hold and feed wire 40 to be used for forming the wire bumps 16 on the bond pad 12 of a semiconductor device 10. To form a wire bump 16 on a bond pad 12, the wire 40 is fed into contact with the bond pad 12, the bond head 102 is brought into contact with the wire 40 and bond pad 12, and the bond head 102 is activated. After the application of sufficient energy to the wire 40 to bond the end thereof to the bond pad 12, the clamps 108 grasp and pull the wire away from the bond pad 12 causing the wire to sever leaving the wire bump 16 bonded to the bond pad 12. Subsequently, the bond head 102 is raised and the punch activated to flatten the wire bump 16 formed on the bond pad 12. As illustrated, the bond pad 12 may have a wire bump 16 formed thereon with the wire bump 16 having another wire bump 16' formed thereon. Any number of wire bumps, such as 16, 16', etc., being formed on the bond pad 12.

Figure 5:
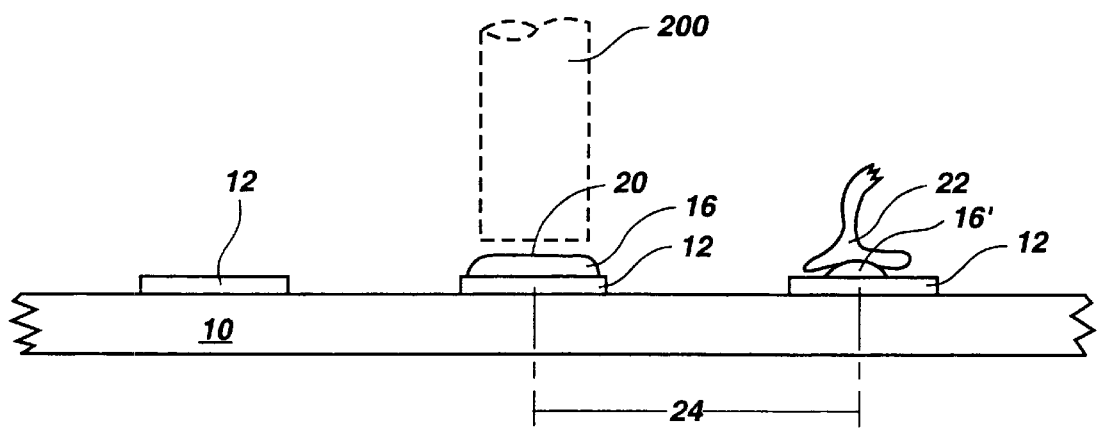
FIG. 5 is a view of a wire bond on a wire bump on the bond pad of a semiconductor die.

Referring to drawing FIG. 5, a wire bump 16 is illustrated having a flattened surface 20 thereon after having been flattened by the punch 106 of the bond head 102.

Also illustrated in drawing FIG. 5 is an unflattened generally hemispherically shaped wire bump 16' located on a bond pad 12 of the semiconductor device 10. By using a hemispherically shaped wire bump 16' a subsequent wire bond 22 may be made thereto wherein the wire bond 22 is larger in diameter than the bump 16' with a satisfactory wire bond being formed as the hemispherical shape of the bump 16' provides the maximum surface area for wire bonding while minimizing the geometric volume of the wire bump 16'. In this manner, the bond pads 12 of the semiconductor device 10 may be placed on a smaller pitch 24 than using conventional ball-type wire bonds while maintaining adequate and satisfactory bond strength of the wire bond 22 to the wire bump 16' and the bond pad 12. The bump 16 may be flattened by the use of a well known tool 200 (shown in dashed lines) which employs heat and an ultrasonic action in a scrubbing motion to flatten the bump 16 for the attachment of a wire bond 22 thereto.

Figure 6:
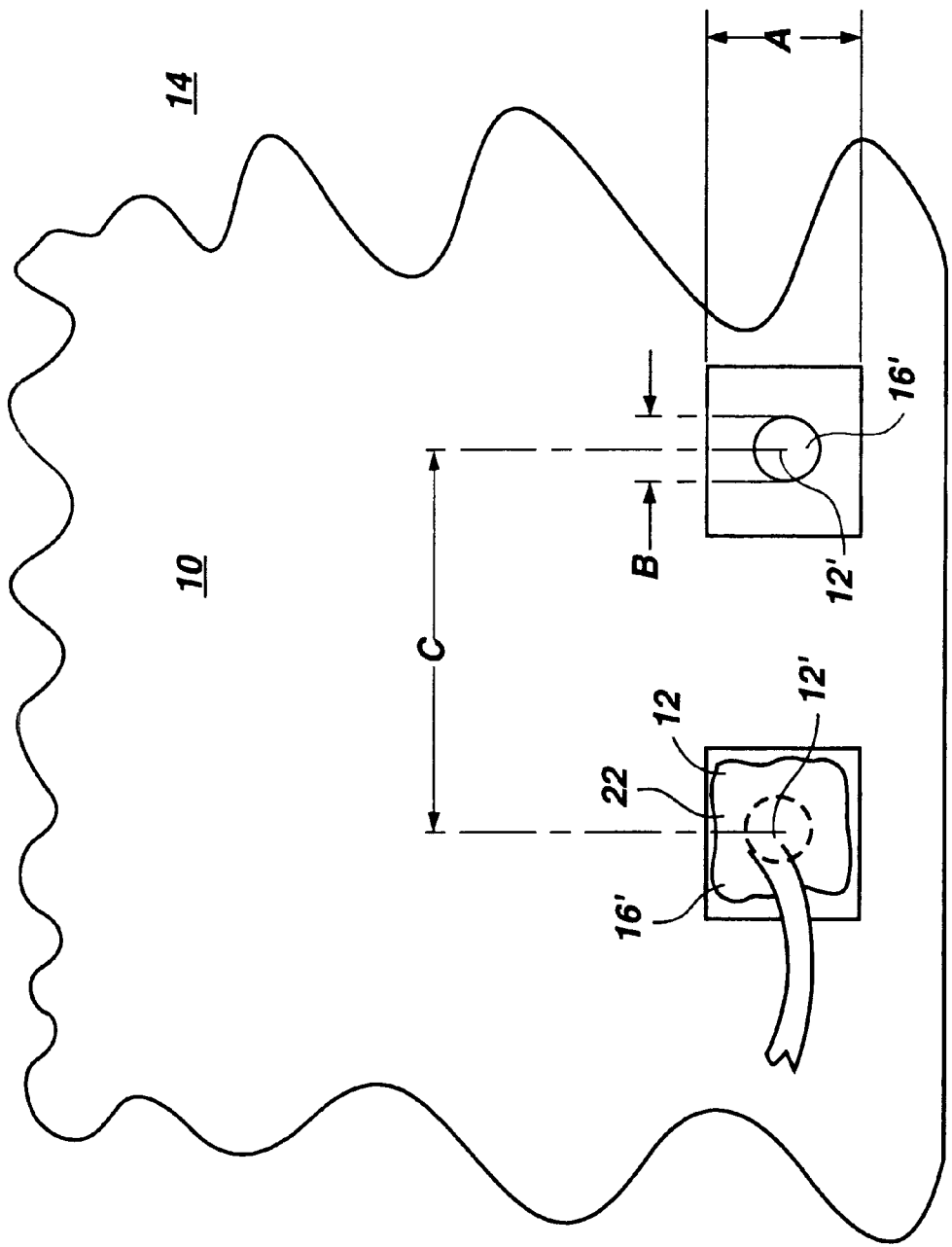
FIG. 6 is a top view of a wire bond on a wire bump on the bond pad of a semiconductor die.

Referring to drawing FIG. 6, bond pads 12 are illustrated having a generally hemispherical shaped wire bump 16' located thereon. In one instance, the bond pad 12 having generally hemispherical wire bump 16' thereon is illustrated having wire bond 22 secured to the bond pad 12 and wire bump 16' with the wire bond 22 substantially covering the entirety of the bond pad 12. By using a generally hemispherically shaped wire bump 16' on the bond pad additional area for the subsequent wire bond 22 is provided on the bond pad 12 thereby allowing the use of a smaller bond pad 12 than would typically be necessary for wire bonding thereby, in turn, allowing the adjacent bond pads 12 to be placed on a closer pitch "C" on the semiconductor device 10. The pitch "C" being generally defined as the distance between adjacent centers 12' of adjacent bond pads 12. The size of the generally hemispherically shaped wire bump 16' in relation to the size of the bond pad 12 may vary depending upon the subsequent wire bond 22 characteristics which are desired. As an example, if a bond pad 12 is provided having a size of three (3) mils. a wire bump 16' having a general size of 1 or 2 mils. may be used, if forming the wire bump 16' from gold wire. In this manner, for fine pitch applications of bond pads 12 the wire bond 22 is kept away from the surrounding circuitry of the semiconductor device 10 and the wire bump 16' may be flattened with additional force and power as applied during forming the wire bond 22 without the risk of damaging the surrounding circuitry of the semiconductor device 10 while forming a high strength wire bond 22.

It will be understood that changes, additions, deletions, and modifications may be made to be present invention which are intended to be within the scope of the claimed invention. Such are the use of a single layer bond pad, the shape of the wire bump, the relative size of the wire bond to the wire bump, etc.

What is claimed is:

1. A method of forming a semiconductor device assembly, said method comprising:

providing a semiconductor device having an active surface having at least one bond pad thereon;

forming a wire bump on at least one bond pad on the active surface of the semiconductor device;

connecting one end of a wire to the wire bump using a ball-type wire bond;

providing a lead frame having at least one lead finger thereon; and connecting another end of the wire to the lead finger using a wire bond.

2. The method of claim 1, further comprising the step of:

flattening the wire bump before bonding the one end of the wire thereto.

3. The method of claim 1, wherein the bond pad is a multi-layer bond pad including at least two layers of different metal.

4. The method of claim 1, wherein the wire bond connecting the one end of the wire to the bond pad of the semiconductor device includes a ball-type wire bond having one of a larger diameter and size than the wire bump.

5. The method of claim 2, wherein the wire bond connecting the one end of the wire to the bond pad of the semiconductor device includes a wedge-type wire bond.

6. The method of claim 1, wherein the wire bump includes a gold wire bump.

7. The method of claim 1, wherein the wire includes a gold wire.

8. The method of claim 1, wherein the wire bump includes a flattened wire bump.

9. The method of claim 1, wherein the wire bump includes a hemispherically shaped wire bump.

* * * * *

UNITED STATES PATENT AND TRADEMARK OFFICE
CERTIFICATE OF CORRECTION

PATENT NO. : 5,976,964
DATED : November 2, 1999
INVENTOR(S) : Michael B. Ball

It is certified that error appears in the above-identified patent and that said Letters Patent is hereby corrected as shown below:

Title page,
Item [56], References Cited, U.S. PATENT DOCUMENTS, after "4,176,443" insert -- * --; after "4,750,666" insert -- * --; after "4,821,148" insert -- * --; after "5,058,798" insert -- * --; after "5,132,772" insert -- * --; after "5,328,079" insert -- * --; after "5,492,863" insert -- * --; after "5,559,054" insert -- * --; after "5,740,956" insert -- * --; after "5,764,486" insert -- * --; and insert -- * cited by examiner --

Column 1,
Line 19, change "connection" to -- connecting --
Line 29, before "both" insert -- or --

Column 2,
Line 27, before "bond" insert -- of --
Line 33, change "cause" to -- causes --
Line 38, before "size" insert -- the --

Column 3,
Lines 37 and 39, change "thermo-sonic" to -- thermosonic --
Line 38, change "ultra-sonic" to -- ultrasonic --
Line 45, after "tolerated," insert -- and --

Column 4,
Line 22, change "extend" to -- extends -- and "terminate" to -- terminates --
Line 27, change "lead finger 50" to -- lead finger 54 --
Line 28, change "lead frame 54" to -- lead frame 50 --
Line 29, after "coating" insert -- 13 --
Line 42, at the beginning of the line change "and" to -- to --
Line 47, change "being" to -- is --

Column 6,
Line 11, change "be" to -- the --
Line 30, change "bonding" to -- connecting --
Line 32, before "bond" insert -- at least one --

UNITED STATES PATENT AND TRADEMARK OFFICE
CERTIFICATE OF CORRECTION

PATENT NO.     : 5,976,964
DATED          : November 2, 1999
INVENTOR(S)    : Michael B. Ball It is certified that error appears in the above-identified patent and that said Letters Patent is hereby corrected as shown below:

Column 6,
Lines 36 and 40, before "bond" insert -- wire bump on the at least one --

Signed and Sealed this

Twelfth Day of July, 2005

JON W. DUDAS
*Director of the United States Patent and Trademark Office*